US011054804B2

(12) United States Patent
Bordegnoni et al.

(10) Patent No.: US 11,054,804 B2
(45) Date of Patent: Jul. 6, 2021

(54) PORTABLE SAFETY CONTROL DEVICE FOR INDUSTRIAL MACHINES IN PARTICULAR ROBOTS

(71) Applicant: Comau S.p.A., Grugliasco (IT)

(72) Inventors: Stefano Bordegnoni, Albese con Cassano (IT); Francesco Ciniello, Grugliasco (IT)

(73) Assignee: Comau S.p.A., Grugliasco (IT)

( * ) Notice: Subject to any disclaimer, the term of this patent is extended or adjusted under 35 U.S.C. 154(b) by 0 days.

(21) Appl. No.: 16/922,525

(22) Filed: Jul. 7, 2020

(65) Prior Publication Data

US 2020/0333763 A1 Oct. 22, 2020

Related U.S. Application Data

(63) Continuation of application No. 15/789,183, filed as application No. PCT/IB2016/053493 on Jun. 14, 2016, now abandoned.

(30) Foreign Application Priority Data

Jun. 15, 2015 (IT) .......................... 102015000023697

(51) Int. Cl.
*G05B 19/409* (2006.01)
*G05B 9/02* (2006.01)
(Continued)

(52) U.S. Cl.
CPC ............. *G05B 19/409* (2013.01); *G05B 9/02* (2013.01); *G06F 1/1626* (2013.01);
(Continued)

(58) Field of Classification Search
CPC .................. G05B 19/409; G05B 9/02; G05B 2219/36159; G05B 2219/36168; G06F 1/1626; G06F 3/0425; H05K 7/1411
See application file for complete search history.

(56) References Cited

U.S. PATENT DOCUMENTS

| 2,642,905 A | 6/1953 | Hewat |
| 3,190,638 A | 6/1965 | Ward |

(Continued)

FOREIGN PATENT DOCUMENTS

| CN | 106965199 A | * | 7/2017 |
| DE | 102010025781 A1 | | 1/2012 |

(Continued)

OTHER PUBLICATIONS

CN-106965199-A Translation (Year: 2017).*

*Primary Examiner* — Jeff A Burke
*Assistant Examiner* — Kyle T Johnson
(74) *Attorney, Agent, or Firm* — Young Basile Hanlon & MacFarlane, P.C.

(57) ABSTRACT

A portable safety control device for use with a portable electronic device to communicate with an industrial machine. The control device includes a body having gripping portion for engagement by a human hand and a supporting portion for engagement with the portable electronic device. In one example, separate enabling and emergency stop switches are positioned on the body proximate the gripping portion within reach of the hand engaged with the gripping portion, and is configured for ease of use by left or right-handed users. The supporting portion is configured and oriented to rest on the forearm of an operator. A control circuit is used to communicate with both the portable electronic device and the industrial machine controller.

20 Claims, 7 Drawing Sheets

(51) Int. Cl.
  *G06F 1/16* (2006.01)
  *G06F 3/042* (2006.01)
  *H05K 7/14* (2006.01)

(52) U.S. Cl.
  CPC ......... *G06F 3/0425* (2013.01); *H05K 7/1411* (2013.01); *G05B 2219/36159* (2013.01); *G05B 2219/36168* (2013.01)

(56) References Cited

U.S. PATENT DOCUMENTS

| | | | |
|---|---|---|---|
| 5,067,573 A | | 11/1991 | Uchida |
| 5,850,358 A | * | 12/1998 | Danielson ........... B60R 16/0231 713/321 |
| 6,101,087 A | * | 8/2000 | Sutton ................. B60R 11/0252 361/679.44 |
| 6,532,152 B1 | | 3/2003 | White et al. |
| 6,939,066 B2 | * | 9/2005 | Goodenough ........ G06F 1/1626 200/5 A |
| 6,967,836 B2 | | 11/2005 | Huang et al. |
| 7,428,143 B1 | | 9/2008 | Jones et al. |
| 8,196,971 B2 | | 6/2012 | Hansen |
| 9,079,317 B2 | * | 7/2015 | Preisinger ................ B25J 19/06 |
| 9,346,175 B2 | | 5/2016 | Krumbacher et al. |
| 2004/0068335 A1 | * | 4/2004 | Ferla .................... G05B 19/425 700/86 |
| 2004/0185701 A1 | | 9/2004 | Yoshie |
| 2004/0248619 A1 | * | 12/2004 | Graiger ................ G05B 19/409 455/566 |
| 2005/0057896 A1 | * | 3/2005 | Homer .................. G06F 1/1632 361/679.35 |
| 2005/0141681 A1 | * | 6/2005 | Graiger ................ G05B 19/409 379/90.01 |
| 2005/0231332 A1 | | 10/2005 | Nihei et al. |
| 2006/0274493 A1 | | 12/2006 | Richardson et al. |
| 2007/0090241 A1 | * | 4/2007 | Risse .................... G06F 1/1632 248/214 |
| 2008/0068519 A1 | * | 3/2008 | Adler ...................... G06F 9/451 348/838 |
| 2008/0187309 A1 | | 8/2008 | Sukenari et al. |
| 2008/0314941 A1 | | 12/2008 | Knych et al. |
| 2012/0037285 A1 | * | 2/2012 | Diebel .................. G06F 1/1628 150/165 |
| 2012/0066873 A1 | * | 3/2012 | Lauder .................. H01F 7/0263 24/303 |
| 2013/0264459 A1 | * | 10/2013 | McCosh ................. H04M 1/04 248/688 |
| 2013/0293430 A1 | | 11/2013 | Henty |
| 2014/0028243 A1 | * | 1/2014 | Rayner ................. H04B 1/3888 320/103 |
| 2014/0033513 A1 | | 2/2014 | Ahee et al. |
| 2014/0168890 A1 | * | 6/2014 | Barnard ................ F16M 11/041 361/679.55 |
| 2014/0376182 A1 | | 12/2014 | Motoishi et al. |
| 2015/0027911 A1 | | 1/2015 | Cakir et al. |
| 2015/0041341 A1 | | 2/2015 | Marshall et al. |
| 2015/0051736 A1 | | 2/2015 | Mu et al. |
| 2016/0257260 A1 | | 9/2016 | Barre et al. |
| 2016/0257404 A1 | | 9/2016 | Ferris |
| 2016/0297067 A1 | * | 10/2016 | Kogan ..................... B25J 13/02 |
| 2016/0300513 A1 | | 10/2016 | Ren et al. |
| 2016/0358105 A1 | * | 12/2016 | Tanaka ..................... B25J 13/02 |
| 2018/0354130 A1 | * | 12/2018 | Preisinger ............ G05B 19/427 |
| 2020/0333763 A1 | * | 10/2020 | Bordegnoni .......... G06F 1/1626 |

FOREIGN PATENT DOCUMENTS

| | | |
|---|---|---|
| DE | 102015206571 B3 | 8/2016 |
| EP | 2722728 A1 | 4/2014 |

* cited by examiner

PORTABLE SAFETY CONTROL DEVICE FOR INDUSTRIAL MACHINES IN PARTICULAR ROBOTS

CROSS-REFERENCE TO RELATED APPLICATIONS

This continuation application claims priority benefit to U.S. patent application Ser. No. 15/789,183 filed Oct. 20, 2017, which is a 35 USC 371 patent application of PCT/IB2016/053493 filed Jun. 14, 2016, which claims priority benefit to Italian patent application serial number 102015000023697 filed Jun. 15, 2015, the entire contents of all applications incorporated herein by reference.

TECHNICAL FIELD

The present invention relates in general to industrial machines, such as robots, which have a control unit. The invention has been developed with particular reference to devices for manual control and/or programming of the aforesaid machines.

BACKGROUND

Some industrial machines, such as robots, are designed to operate in a manual mode and at least one automatic mode, which can be usually selected on a control unit of the machine. The manual operating mode is selected when the machine is to be controlled by an operator, for example for programming purposes, whereas the automatic operating mode is selected when the machine is to operate in an autonomous way, i.e., with operation governed exclusively by the corresponding control unit.

For example, in the case of an industrial robot with a number of degrees of freedom the activity of manual control prevalently consists in teaching the robot the path that a point of its manipulator must repeat in an automatic way in the course of the normal operating steps in order to carry out a certain operation. This point is usually constituted by the so-called tool center point (TCP), which identifies the position of the active part of an end effector of the manipulator, here understood as an operating tool or else as an ensemble constituted by a gripping device and the corresponding workpiece being moved.

Most of the programming time is dedicated to manual control of the robot in order to identify the optimal points of the paths of movement of the TCP and store the corresponding coordinates thereof. For this purpose, a portable programming terminal is typically used, also known as "teach pendant". For manual control of the variations of posture of the manipulator, the operator uses specific pushbuttons of the teach pendant, known as "jog" pushbuttons or keys, which control movements of one or more axes of the robot. By acting on the jog pushbuttons of the teach pendant, the TCP can be moved in a specific positive or negative direction within a reference system selected by the operator from among a plurality of possible reference systems.

In the majority of the known solutions, the control unit of a robot can operate according to different modes or states, amongst which a programming mode. In the programming mode, an operator acts in the proximity of the manipulator, as explained previously, for controlling operation thereof, storing the program steps, and programming the operating activity, by means of the teach pendant.

The step of programming of the robot is clearly the one that entails the biggest risks for an operator, who must follow the TCP closely in order to control visually positioning thereof, continuously moving around the manipulator. For this reason, the teach pendant is equipped with an emergency-stop switch and an enabling switch or enabling device. In extreme synthesis, if, during programming, the enabling device is not kept by the operator in a predetermined switching position, the manipulator cannot perform any movement; on the other hand, the emergency-stop pushbutton is activated by the operator in particularly critical cases to stop operation of the robot completely.

The programming terminals of the type referred to are dedicated devices, i.e., designed specifically according to the industrial machine that is to be controlled and/or programmed manually and produced in relatively limited series. These terminals are hence generally costly and take quite a long time to be developed.

A dedicated programming terminal of the indicated type, provided with an ergonomic case and a touch screen is disclosed by US 2004/248619 A.

In order to solve the above drawbacks, use of portable electronic apparatuses of a standard type has been proposed, such as for example smartphones, palmtops, tablets, PDAs (Personal Digital Assistants), and the like. These apparatuses are widely available on the market at contained costs and have in general a capacity of processing, storage, and data connection that is adequate for use as devices for control of industrial machines, after prior provision of an adequate software.

These standard electronic apparatuses are not, however, adequate to satisfy the safety requirements necessary for carrying out activities linked to manual control of an industrial machine, such as a robot, in particular in relation to the need to provide an emergency-stop switch and an enabling switch.

For this reason, there have been proposed safety control devices pre-arranged for connection to the control unit of a robot or of a similar industrial machine and configured for receiving in a removable way a portable electronic apparatus of the type indicated above. These control devices in general include a body having a gripping portion, which can be gripped by a user, to which an emergency-stop switch and an enabling switch are associated, and a supporting portion to which the portable electronic apparatus can be coupled in a removable way.

Known from US 2005/141681 A1 is one such safety control device, having a generally elongated box-like body, which houses the control circuit of the device and defines a seat within which a PDA apparatus can be inserted. In a first embodiment (see in particular FIGS. 1-3 of the document) the aforesaid seat has a lateral opening and is conceived for receiving slidably the PDA apparatus, in such a way that a display of the latter is accessible from the front of the box-like body. Set within the aforesaid seat is an interface connector in signal communication with the control circuit, which can be fitted in a corresponding interface connector of the PDA apparatus itself. In this configuration, provided on the two opposite longitudinal sides of the box-like body are respective switches, which perform enabling functions, whereas provided at the top of the box-like body is a switch, which performs functions of emergency stop, these switches being in signal communication with the internal control circuit of the device. In this embodiment, the body of the device can be gripped by the operator laterally with his hand so as to render possible pressing of one of the enabling switches. This embodiment is advantageous in so far as the device can be used in the same way by a right-handed operator and a left-handed operator. The general conformation of the device is, however, generally disadvantageous from the ergonomic standpoint, at least for the reason that the weight of the device weighs completely on just one hand of the operator, who must constantly keep an enabling switch depressed.

In a second embodiment described in the aforementioned document (see in particular FIGS. 6 and 7 of the document), the box-like body of the device is shaped so that it can be supported on the forearm of the operator, when he grips the gripping portion with one hand. In this embodiment, the seat for the PDA apparatus itself consists of a recess defined at the front of the box-like body, in which the apparatus itself can be fitted from above. Also in this case, provided within the seat is at least one interface, which can be connected to an interface of the PDA apparatus itself. In this embodiment, the gripping portion of the box-like body is basically defined at a longitudinal end of the box-like body, with an enabling switch on the back of the box-like body, so that it can be operated with a thumb, and with the emergency-stop switch positioned on the corresponding end face of the box-like body. This second embodiment is advantageous since the weight of the device can be distributed on the operator's forearm, without weighing completely on his hand, which must constantly keep the enabling switch depressed.

The device referred to in the aforesaid prior document is a substantially dedicated device, i.e., specifically designed for mechanical and electronic coupling with a well-defined type of PDA apparatus, having certain physical dimensions and certain positions of the corresponding connection interfaces. The relative position of the safety devices is somewhat inconvenient for the operator since—in the aforesaid second embodiment—switching of the enabling switch entails a constant effort of just the thumb of the operator. In addition, to enable use of the device both by right-handed operators and by left-handed operators, on the back of the box-like body there must be provided two enabling switches, in substantially opposite positions. The body of the device is moreover relatively cumbersome and heavy.

Known from DE 102010025781 A1 is a further safety control device, which can be coupled to a small standard electronic apparatus, such as a smartphone, a PDA apparatus, a palmtop or pocket personal computer, a netbook or a notebook, or the like.

In this case, the body of the device has a lateral gripping portion, provided on a longitudinal face of which is an enabling switch and provided on the top of which is an emergency-stop switch. The gripping portion rises as a vertical bar from a lower supporting portion, associated to which are two arrest elements, configured for constraining laterally the portable electronic apparatus in an upright position, one of these arrest elements being position-adjustable. The gripping portion can be easily gripped by an operator like a handle, thereby enabling switching of the enabling switch.

The solution known from DE 102010025781 A1 presents the advantage that to the safety control device there can be combined electronic apparatuses of different dimensions, by virtue of the presence of a position-adjustable arrest device, and moreover that the device can be used indifferently by right-handed and left-handed operators. The general conformation of the device is, however, disadvantageous from the ergonomic standpoint, both for the relative arrangement between the gripping portion and the upright position of the electronic apparatus and for the fact that the weight of the device weighs completely on the hand of the operator who must constantly keep the enabling switch depressed.

In this regard, it is also to be considered that the enabling switch must generally be a pushbutton switch having three positions, and precisely a position of release, an intermediate switching position, and a final switching position. As has already been mentioned, the position of release prevents the operator from imparting movement commands on the robot, whereas the intermediate switching position is the one that must be kept by the operator in the course of programming of the robot in order to enable movements thereof. The final switching position, i.e., the position where the switch is pressed right down, corresponds to a so-called panic state and is aimed at producing basically the same effects as the position of release. The conformation of the gripping portion according to DE 102010025781 A1 and the corresponding position of the enabling switch renders it problematical for the operator to carry the device without causing any accidental switching of the enabling switch into the aforesaid final position.

SUMMARY

In the light of what has been set forth above, the present invention is basically aimed at providing a portable safety control device having a structure that is particularly advantageous from the ergonomic standpoint in order to facilitate and render less tiring the activity of use of the device itself.

Another aim of the invention is to provide a safety control device having a structure that is simple, inexpensive, and light, as well as particularly flexible in relation to the types of electronic apparatuses that can be combined to the device itself.

One or more of the above aims are achieved, according to the invention, by a portable safety control device having the characteristics indicated in the claims. The claims form an integral part of the technical teaching provided herein in relation to the invention.

BRIEF DESCRIPTION OF THE DRAWINGS

Further purposes, characteristics, and advantages of the present invention will emerge clearly from ensuing description and from the annexed drawings, which are provided purely by way of explanatory and non-limiting example and in which.

DETAILED DESCRIPTION

Reference to "an embodiment" or "one embodiment" in the framework of the present description is meant to indicate that a particular configuration, structure, or characteristic described in relation to the embodiment is comprised in at least one embodiment. Hence, phrases such as "in an embodiment", "in one embodiment", and the like that may be present in various points of the present description do not necessarily all refer to one and the same embodiment. Moreover, the particular configurations, structures, or characteristics may be combined in any adequate way in one or more embodiments. The references used in what follows are only provided for convenience and do not define the sphere of protection or the scope of the embodiments. It is moreover to be pointed out that in the sequel of the present description only the elements useful for an understanding of the invention will be described.

Figure 1:
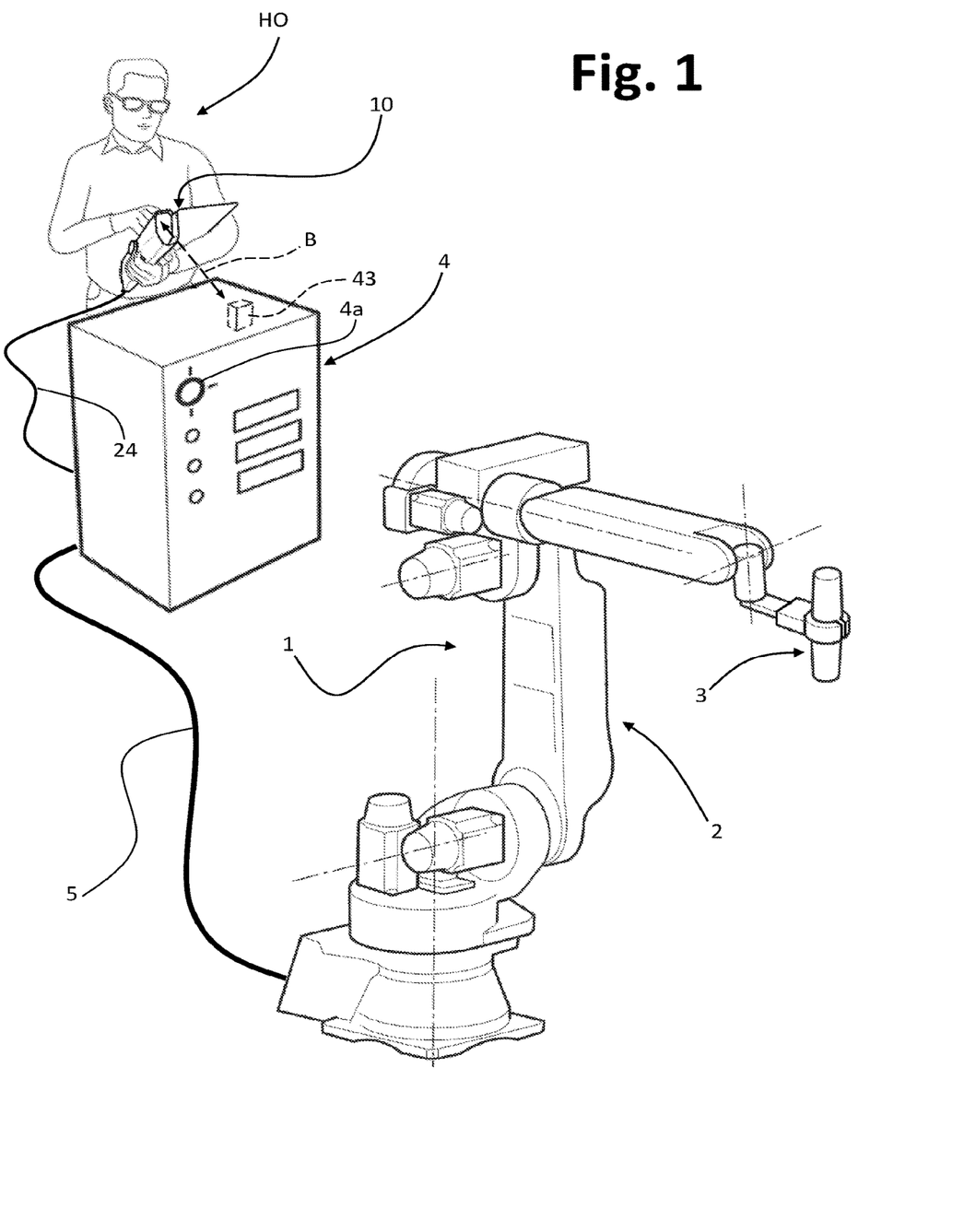
FIG. 1 is a schematic perspective representation aimed at exemplifying a possible use of a control device according to the invention, in combination with an industrial machine, in particular a robot.
Figure 2:
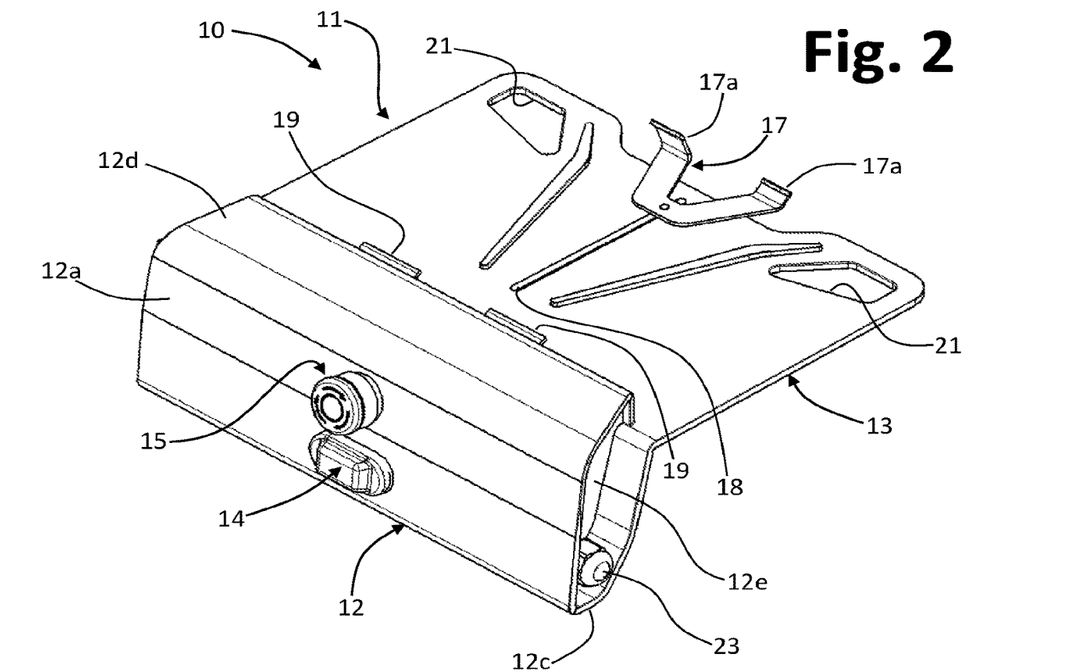
FIG. 2 is a front perspective view of a safety control device.
Figure 3:
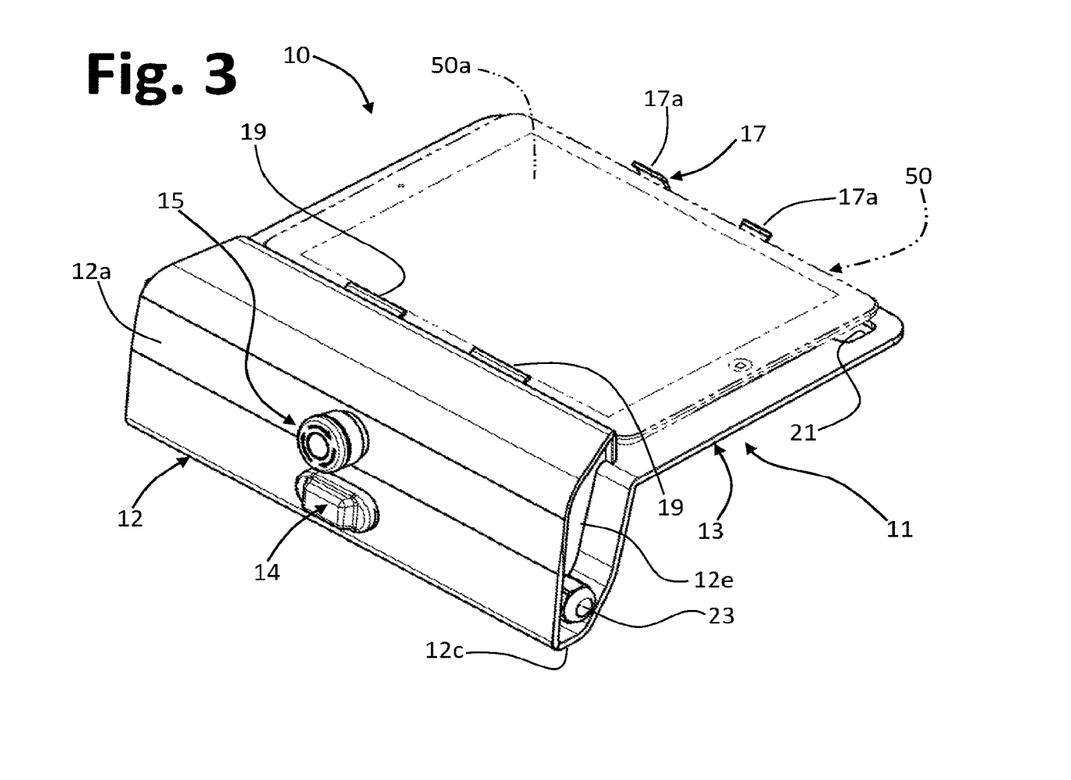
FIG. 3 is the front perspective view of the safety control device of FIG. 3 with an electronic apparatus connected to the safety control device.

FIG. 1 is a schematic representation of an industrial machine comprising a portable safety control device according to the invention. In the non-limiting example shown, the industrial machine is an anthropomorphic robot 1, having a structure 2 that is movable according to a number of degrees of freedom. In the example illustrated, associated to the end of the movable structure 2 is a tool or end effector, designated by 3, represented for example by a welding torch. The invention can in any case be used in combination with other types of industrial machines, such as for example cartesian and SCARAs robots, automated systems, work cells, etc.

According to techniques in themselves known, the movement of each of the movable parts of the structure 2 is controlled by a respective electric motor with corresponding reducing gear transmission. The movements of the structure 2 and the operations of the end effector 3 are managed by a control unit, designated by 4 in FIG. 1, which is located in a remote position with respect to the structure 2 and is connected to the latter via a cable 5. In one embodiment, the control unit 4 is able to operate according to at least three different modes or states, such as for example a programming mode, an automatic mode, and a remote mode. Preferably, these operating modes can be selected on the control unit 4, via corresponding selection means, designated as a whole by 4a.

In the programming mode, an operator HO acts in the proximity of the robot 1, for controlling operation thereof, storing the program steps, and programming the operating activities, by means of a portable electronic apparatus associated to a safety control device according to the invention, designated as a whole by 10. As will emerge clearly hereinafter, the device 10 has a respective control circuit, which can be connected in signal communication with the control unit 4 of the robot 1. In the automatic mode, the robot 1 carries out an operating program thereof, obtained as explained above, possibly in combination with other robots or automatic apparatuses, normally within a cell protected from access of staff, but under the visual control of the operator HO. Also in the remote mode, the robot 1 carries out an operating program of its own within a cell normally protected from access of staff, but in this case start of execution of the program comes from a cell supervisor, such as a PLC, which for example controls both the robot and other automatic apparatuses present in the cell itself.

A portable safety control device 10 according to possible embodiments of the invention is illustrated schematically in FIGS. 2-7.

The device 10 has a body 11 defining a gripping portion 12 and a supporting portion 13. In various embodiments, the gripping portion 12 and the supporting portion 13 can be made of a single piece, or else made of different pieces assembled together, even made of different materials. For example, in one embodiment, the gripping portion 12 is made entirely or prevalently of a metal material, preferably aluminium, or another light metal, or a light alloy, whereas the supporting portion is made of plastic material. The use of the preferred materials indicated enables containment of the weight of the device.

The gripping portion 12 is designed to be gripped by the hand of an operator. In various embodiments, the gripping portion 12 is hollow and extends longitudinally, i.e., is generally tubular, in order to house within it a control circuit of the device 10. Preferably, the longitudinal dimension of the supporting portion 13 is the same or substantially the same as that of the gripping portion 12.

In the example illustrated, the portion 12 has two generally opposite longitudinal walls or faces, designated by 12a and 12b, as well as a lower longitudinal wall or face 12c and an upper longitudinal wall or face 12d, which each extend between the faces 12a and 12b. These faces 12a-12d will be also defined hereinafter for simplicity as "outer face", "inner face", "lower face", and "upper face", respectively. In preferred embodiments, the gripping portion 12 is shaped in such a way that the thumb and at least one first portion of the palm of the operator's hand rests on the inner face 12b, whereas at least one end portion of the index finger, middle finger, ring finger, and little finger rest on the outer face 12a, and with an intermediate part of his hand that instead is in a position corresponding to the lower face 12c. In this way, gripping of the portion 12 is particularly natural.

Figure 7:
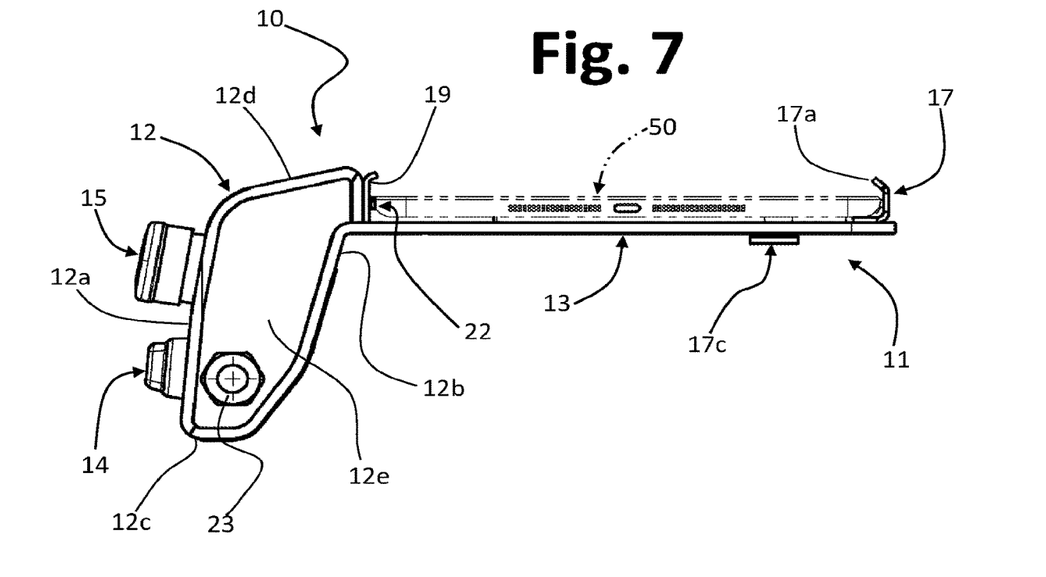
FIG. 7 is a left side view of the safety control device of FIG. 5.

For the aforesaid purposes, in various embodiments, the faces 12a-12c are preferably sized and arranged so as to bestow on the gripping portion 12 a generally tapered conformation, in particular from top downwards, as is clearly visible, for example, in FIG. 7.

The supporting portion 13 extends laterally starting from the gripping portion 12, for supporting a portable electronic apparatus thereon, designated as a whole by 50, which here is assumed as being a tablet of a type available on the market, for example an IPAD® tablet produced by Apple Inc. As will emerge clearly, the device 10 has for this purpose an interface arrangement, for connecting in signal communication the corresponding control circuit to the electronic apparatus 50. In general, the device 10 according to the invention can be used in combination with standard or commercially available portable electronic apparatuses of various types, such as smartphones, tablets, PDAs, palmtops, or pocket computers. Very preferably, these devices are devices equipped with a touch screen.

Figure 8:
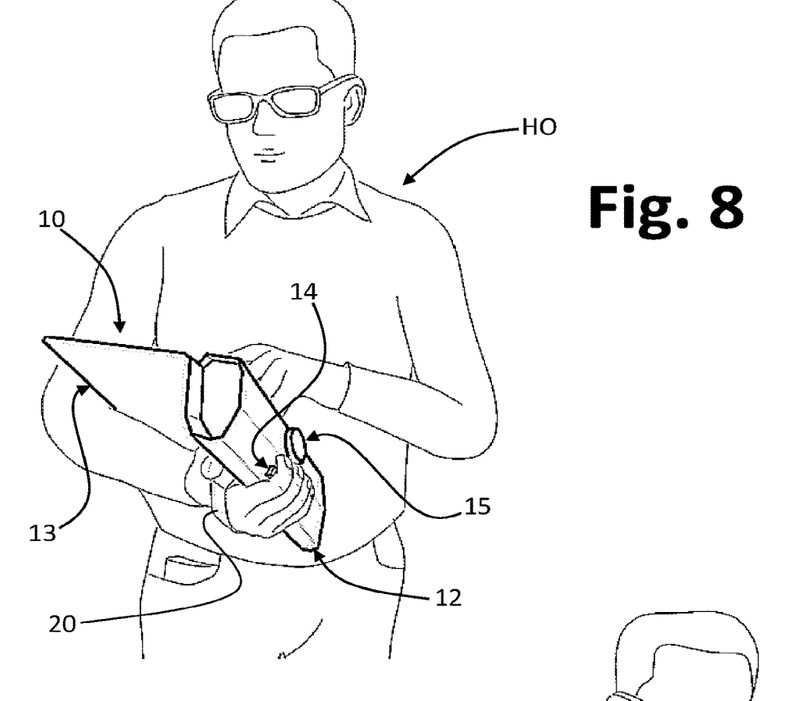
FIG. 8 is schematic perspective view of an example of a modality of gripping of a safety control device according to the invention.
Figure 9:
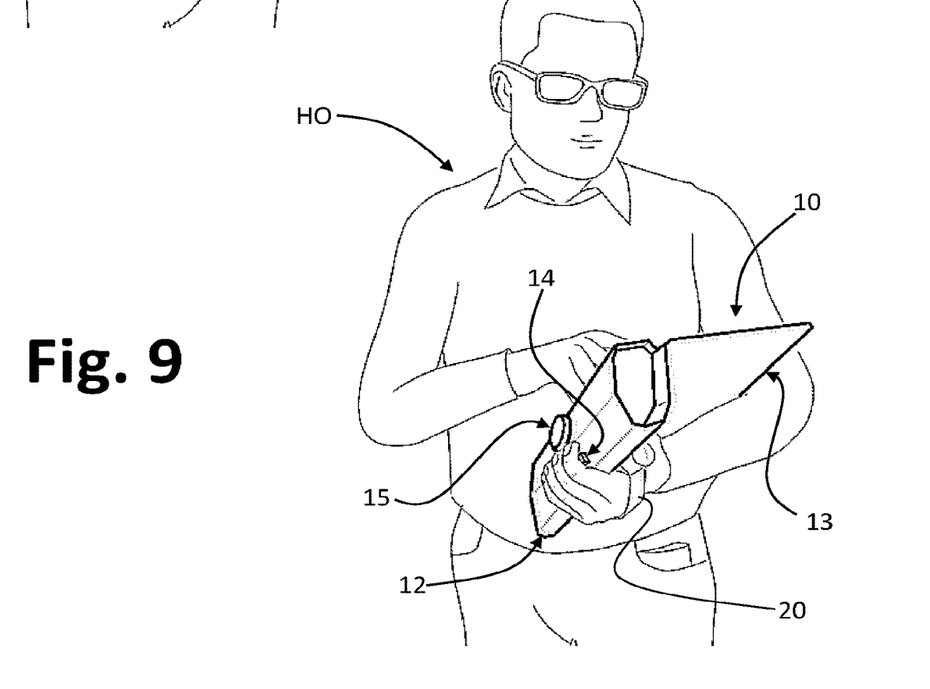
FIG. 9 is a schematic perspective view of an alternate example of a modality of gripping of a safety control device according to the invention.

The body 11 is shaped as a whole in such a way that the back of the supporting portion 13 is designed to rest on the forearm of an operator, when the gripping portion 12 is gripped by the corresponding hand of the operator (see FIGS. 8-9).

Associated to the gripping portion 12 of the device 10 are two safety control members, designated by 14 and 15, which are connected in signal communication with the internal control circuit of the device 10 and can be operated by the operator HO to cause transmission of respective safety information to the control unit 4 of the robot 1. More in particular, in various embodiments, the aforesaid two control members 14 and 15 are represented by an enabling switch and an emergency-stop switch, respectively, both of which are obtained, for example, via electric switches of a conception in itself known in the field, in particular pushbutton switches. In various embodiments, the enabling switch 14 is a pushbutton switch having three positions, and precisely a position of release, an intermediate switching position and a final switching position where it is pressed right down (panic state), as indicated in the introductory part of the present description.

According to a characteristic of the invention, the control members 14 and 15 are both positioned on the outer face 12a of the gripping portion 12, with at least one of the control members that is positioned so as to be within the reach of more than one finger of the hand that grips the above portion 12.

Always in accordance with the invention, the supporting portion 13 has a substantially two-dimensional configuration, i.e., is substantially plate-shaped and extends laterally from the inner face 12b in such a way that the front of the portion 13 defines a resting surface for the back of the casing body of the electronic apparatus 50, the touch screen or display 50a of which is hence accessible from above.

Once again according to the invention, the plate-shaped supporting portion 13 has associated thereto at least one element of constraint, designated as a whole by 17, prearranged for locally securing the electronic apparatus 50, i.e., the casing body thereof, on the portion 13 itself.

The fact that the control members 14 and 15 are both positioned on the outer face 12a of the portion 12 is advantageous from the ergonomic standpoint. Each of the members 14 and 15 is normally designed to be operated by a respective hand of the operator HOP (the member 14, with the hand that grips the portion 13 and the member 15 with the other hand). When the operator is required to switch the control member 15 (emergency stop) with one hand, the portion 12 is safely gripped by the other hand, with the corresponding thumb and part of the palm that effectively counter the action of thrust exerted on the member 15: this contributes to guaranteeing an immediate and safe switching of the member 15. The fact that at least one of the control members, and in particular at least the member 14, is within the reach of the index finger, middle finger, ring finger, and little finger of the hand that grips the gripping portion 12, enables the hand itself to operate in a simple way on the member itself in order to cause the desired condition of switching thereof.

Anyway not excluded is the case of a different positioning of the control member 15, for example on the upper face 12d of the gripping portion 12.

The fact that the supporting portion 13 is substantially plate-shaped and is provided with one or more local constraint elements enables definition of an extensive resting surface for the electronic apparatus, without it being necessary to provide a box-like body in which to define a housing seat for the apparatus. Thanks to the above characteristics, the portion 13 has a very contained weight, to the advantage of reduction of the overall weight of the device 10. Moreover, the portion 13 offers a sufficiently extensive surface for supporting various types of electronic apparatuses, which have dimensions of lateral encumbrance that are very different from one another (and hence, for example, a plurality of tablets or smartphones which have touch screens with different dimensions or aspect ratios).

The element or elements of constraint may be of various nature and complexity, as well as being configured for securing in position apparatuses of different dimensions, in a removable way. For example, in simpler embodiments, elements of constraint are provided made of elastic or resilient material, for example in the form of bands designed to withhold the electronic apparatus 50 on the portion 13 elastically and designed for cooperating with electronic apparatuses of different dimensions, by virtue of their elasticity. For this purpose, there may also be provided bands or straps with corresponding engagement portions, for example of a VELCRO™ type, in order to enable their useful length to be adapted according to the dimensions of the apparatuses 50 to be coupled to the portion 13. The aforesaid bands or straps may extend in the longitudinal and/or transverse direction of the body 11 of the device 10.

According to other embodiments there may be provided one or more members of constraint mounted in an adjustable way on the supporting portion 13. A member of this type is designated as a whole by 17 in the figures.

Figure 6:
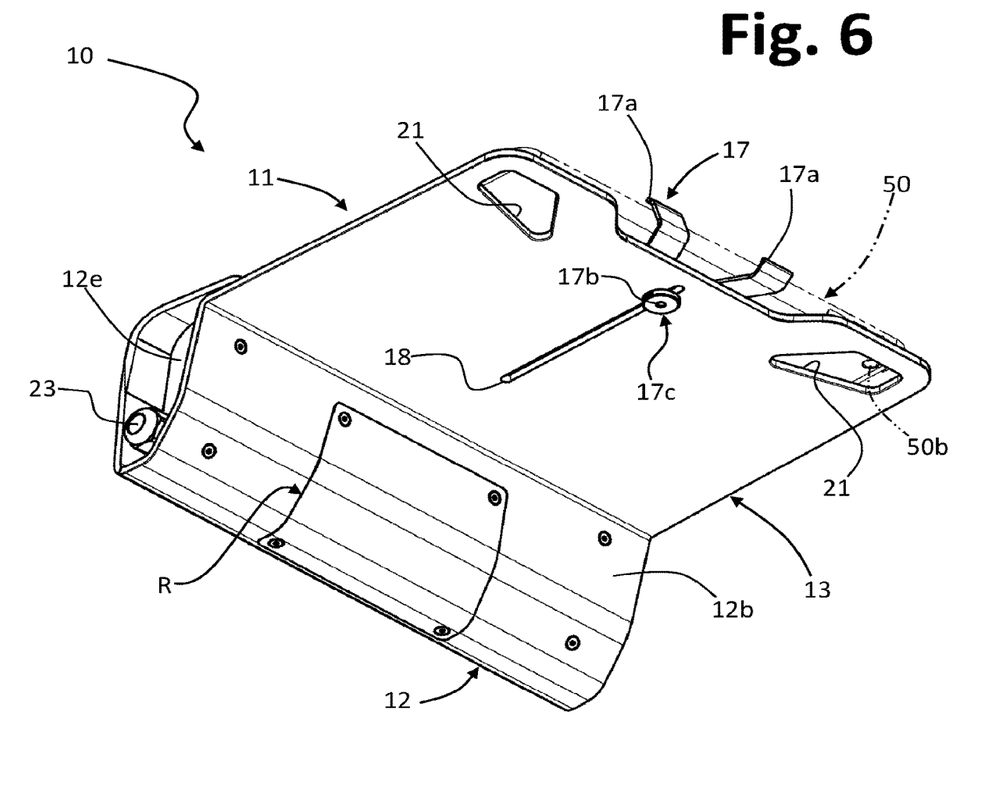
FIG. 6 is a bottom rear perspective view of the safety control device of FIG. 5.

In the example illustrated, the member 17 has a body defining two arms 17a, here generally divergent from one another starting from a common base, the distal ends of which are generally bent or curved so as to be able to co-operate with the apparatus, in particular with an edge thereof that is in a position generally opposite to the gripping portion 12. Preferably, the body of the member 17 is made of a plastic and/or elastically flexible material. In the example, the member 17 is mounted so as to slide on the portion 13 in a direction generally transverse to the longitudinal extension of the gripping portion 12. For this purpose, in the portion 13 a transverse slot 18 is defined, slidably engaging in which is a threaded stem 17b (FIG. 6) that projects at the bottom from the body of the member 17. The body of the member 17 rests on the front of the portion 13, with an end portion of the stem 17b that projects at the bottom from the slot 18, on the aforesaid projecting portion there being engaged a clamping wheel 17c (FIG. 6). As may be readily understood, the position of stop of the member 17 along the slot 18 can be varied according to a dimension of lateral encumbrance of the electronic apparatus 50 to be coupled to the device 10.

In various embodiments, the supporting portion 13 extends from an intermediate position of the inner face 12b, with reference to the height of the latter, where this position in height is in any case closer to the upper face 12d than to the lower face 12c. In this way, between the supporting portion 13 and the gripping portion a step can be defined, i.e., a contrast wall for the edge of the body of the body of the electronic apparatus 50 that is closer to the gripping portion 12. This contrast wall is designated by 12b1 for example in FIGS. 4 and 5.

In various embodiments, also the gripping portion 12 has associated thereto one or more means of constraint for the electronic apparatus 50. This characteristic is preferable when the means of constraint associated to the supporting portion 13 are operative in a position generally opposite to the gripping portion 12, such as for example in the case of the member 17 described previously. In embodiments of this type, the means of constraint associated to the gripping portion can be conveniently located in a position corresponding to the contrast wall 12b1. A case of this sort is, for example, exemplified in the figures, where designated by 19 are two constraint members associated to the wall 12b1, preferably made of resilient material in order to provide functions of antiscratch contrast elements for the edge of the electronic apparatus 50. One or more elements of constraint 19, which have even a conformation different from the one exemplified, can be overmoulded to the gripping portion 12, in particular if this is made of plastic material.

In preferred versions of embodiment of the invention at least one of the members 14 and 15, preferably both, is in an intermediate position of the gripping portion 12, with reference to the longitudinal dimension of the latter. This positioning is particularly advantageous, in so far as it enables the device 10 to be provided with a single control member 14 to perform enabling functions, instead of a pair of them, as for example in US 2005/141681 A1. From an ergonomic standpoint, in fact, the device 10 can preferably be used both by right-handed operators and by left-handed operators, as is clearly exemplified in FIGS. 8 and 9. From these figures, the similar modes of switching of the control member 14 in the two conditions emerge clearly. The presence of a single member 14 simplifies production of the device to the advantage of the reduction of its cost and weight. From FIGS. 8 and 9 it may be appreciated how, in preferred embodiments, at the inner face 12b, underneath the supporting portion 13, there can be advantageously fixed a loop-shaped strap 20 (see FIGS. 8 and 9), which can be engaged by the hand gripping the portion 12. In this way, even by releasing temporarily gripping of the portion 12, the risk of the device 10 being dropped is prevented. Preferably, moreover, on at least part of the gripping portion 12 a rubber part is provided, designated by R in FIG. 6, aimed at facilitating gripping. The rubber part R can extend over part of the inner face 12b and/or of the lower face 12c, preferably in a position aligned in a direction transverse to the control member 14.

In various embodiments, the control members 14 and 15 are positioned so as to be both within the reach of more than one finger of the hand that grips the gripping portion 12. As has been said, the members 14 and 15 are normally designed to be activated with different hands, but the characteristic in question may enable, if need be, the operator to act simultaneously on the two members 14 and 15 with the fingers of just the hand that grips the portion 12. Preferably, for this purpose, the two control members 14 and 15 are in positions generally aligned to each other in a transverse direction of the outer face 12a of the gripping portion 12.

As is known, various standard electronic apparatuses 50 which can be used for purposes of implementation of the invention—such as for example smartphones and tablets—envisage at their back the optics of a photographic camera or video-camera. The use of such an image-shooting device by the operator who is holding the device 10 may prove useful during programming or supervision of operation of the robot 1, for example, when capture of the image of a given operating condition of the machine becomes necessary. For this reason, in various embodiments, the supporting portion 13 preferably has, in its generally peripheral position, at least one through opening or at least one recess on its edge: the reason for this is to enable positioning of the electronic apparatus 50 on the portion 13 with a corresponding rear image-shooting element in a position corresponding to the aforesaid through opening or recess. This characteristic is visible, for example, in FIG. 6, where designated by 21 are two of the aforesaid openings, located at one of which is a rear shooting device 50b of the electronic apparatus 50. Of course, the number and/or shape and/or position of the openings 21 may be different from the one exemplified in order to cover a wide range of cases of devices 50 provided with a rear image-shooting member 50b.

In various embodiments, the device 10 comprises detection means, configured for detecting the presence of the electronic apparatus 50 associated to the device 10. These detection means are connected in signal communication with the internal control circuit of the device 10 and comprise at least one of a position-sensor device and the aforesaid interface arrangement used for connecting in data communication the electronic apparatus 50 to the control circuit of the device 10, where this interface preferably comprises a wireless transceiver module. In preferred embodiments, as described hereinafter, the device 10 includes both of the detection means exemplified.

The figures exemplify the case of a sensor 22 positioned on the inner wall 12b of the gripping portion 12, in particular above the resting surface 13a defined by the supporting portion 13, i.e., in a position corresponding to the contrast wall 12b1. In the example illustrated, the sensor 22 is a microswitch or similar electromechanical device, having a corresponding actuation element, which, in the absence of the device 50, projects from the gripping portion 12 in the direction of the supporting portion 13. As may be readily understood, when the electronic apparatus 50 is positioned on the portion 13 with an edge thereof adjacent to the wall 12b1, a displacement of the aforesaid actuation element is brought about, with consequent switching of the microswitch 22, which signals to the control circuit the physical presence of the electronic apparatus 50 on the device 10. Of course, the sensor 22 may be a sensor of a type different from the one exemplified, such as a proximity sensor or an optical sensor. As will emerge clearly hereinafter, the presence of a sensor of physical position is preferable when the electronic apparatus 50 is interfaced with the control circuit of the device 10 in wireless mode.

As mentioned previously, the gripping portion 12 is generally hollow, and preferably housed therein is the control circuit of the device 10 and, preferably, also the corresponding interface arrangement with the electronic apparatus 50, when this arrangement is of a wireless type. Preferably housed within the portion 12 is at least one battery used for supply of the control circuit of the device 10. In possible embodiments, within the portion 12 a backup or buffer battery is also provided for recharging a battery of the electronic apparatus 50.

The gripping portion 12 has two longitudinal end walls, designated by 12e and 12f in the figures, generally opposite to one another. In various embodiments, positioned on at least one of these end faces 12e and 12f is at least one of a connection port, connected in signal communication with the internal control circuit of the device 10, and a gland or bushing element. Preferably, the end walls 12e and 12f are in a position at least slightly recessed with respect to the longitudinal end of the faces 12a-12d in such a way that the aforesaid bushing element and/or the aforesaid at least one connection port are/is in a protected position.

A bushing element is designated by 23 for example in FIGS. 1-2 and 5-7 and is advantageously used for passage of a cable (designated by 24 in FIG. 1) necessary for connection of the internal circuit of the device 10 to the control unit 4 of the robot 1. It should be noted, however, that the presence of the bushing element 23 and of the cable 24 is optional, in so far as in various embodiments the connection between the device 10 and the control unit 4 is obtained in wireless mode.

Figure 4:
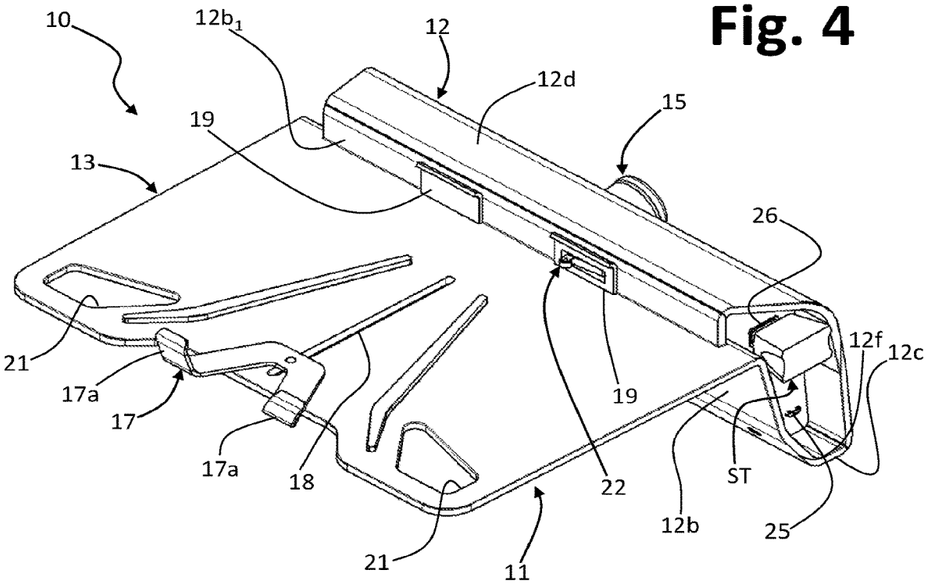
FIG. 4 is a rear perspective view of the safety control device in FIG. 2.
Figure 5:
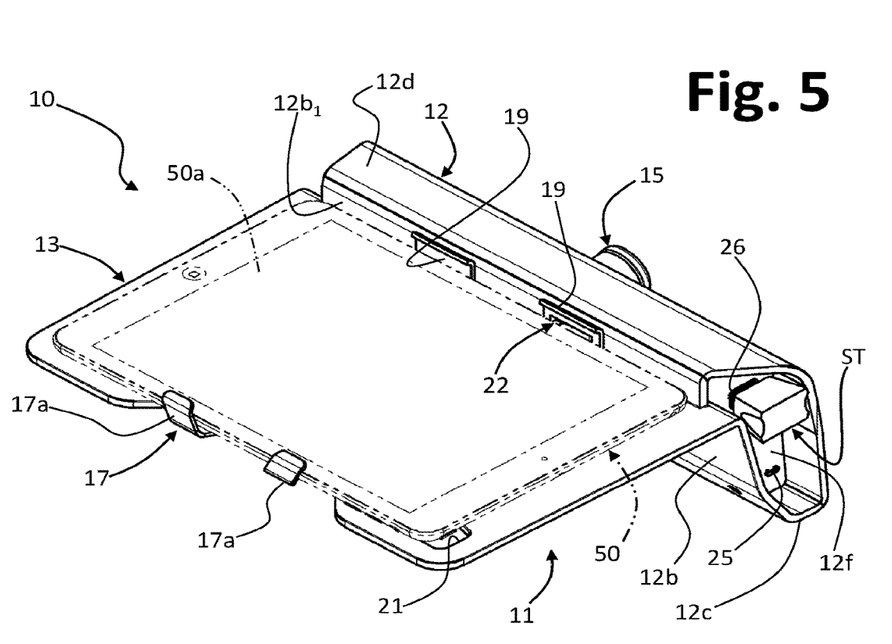
FIG. 5 is a rear perspective view of the safety control device of FIG. 4 with an electronic apparatus connected to the safety control device.

Conversely, in FIGS. 4 and 5 designated by 25 and 26 are two connection ports (one of which is visible only partially). These ports may be of any type and standard known in the sector, for example USB ports and/or RS-232 ports, etc. Obviously, a number of ports of different types may be provided, on one or both of the walls 12e and 12f.

In one embodiment, a connection port 25 or 26, for example of a USB type, can be used for interfacing with a cable the internal circuit of the device 10 to the electronic apparatus 50, via a corresponding connection port of the latter. In this way, an intrinsically safe physical or wired interfacing between the control device 10 and the electronic apparatus 50 is obtained.

In one embodiment, a connection port 25 or 26, for example of a USB type, may be provided for connecting by means of a cable a buffer battery internal to the portion 12 with the electronic apparatus 50, for supply of the latter and/or recharging of the corresponding battery.

In one embodiment, and as highlighted, for example, in FIGS. 4 and 5, a connection port of the device 10, for example a port of a USB type, can be used for removable connection of a so-called safety token, designated by ST, i.e., a physical device designed to carry out an authentication between the internal circuit of the device 10 and the control unit 4 of the robot 1. This possibility proves advantageous when the internal circuit of the device 10 comprises a wireless communication module, for establishing a communication line with a corresponding wireless module of the control unit 4, where this line is designed for transmission of the information on the status of the safety control members 14 and 15. In this case, in fact, it is necessary to establish a unique pairing between the control unit 4 and the device 10 for the purposes of safe communication of the aforementioned information.

Figure 10:
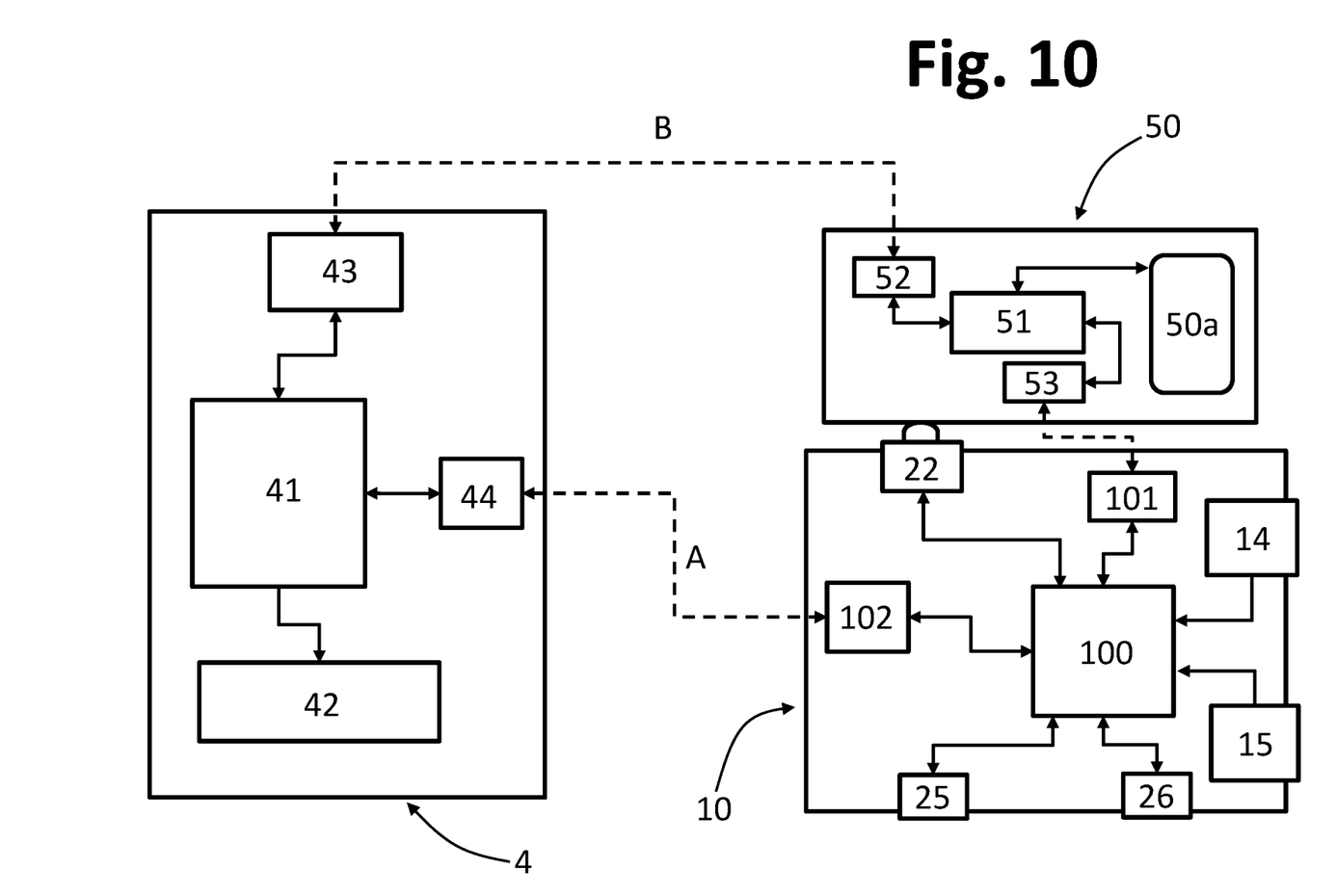
FIG. 10 is a simplified schematic circuit diagram, aimed at exemplifying possible modalities of interaction between a safety control device according to one embodiment of the invention, a control unit of an industrial machine, and an electronic apparatus associated to the control device.

FIG. 10 is a schematic illustration, merely by way of example, of possible modes of connection between a control device 10, a control unit 4, and an electronic apparatus 50.

In the simplified example, the unit 4 has a processing assembly, represented schematically by the block 41, which controls general operation of the robot 1, including the logic for management of the safety functions, represented by the block 42. Connected to the processing assembly 41 are a first communication interface and a second communication interface, designated by 43 and 44. The interface 43 is preferably represented by a wireless communication module, for example operating according to the Wi-Fi standard, whereas the interface 44 can be alternatively represented by a wired connection interface or else a further wireless communication module, preferably operating according to a standard different from that of the module 43, for example the BLUETOOTH™ standard.

Designated as a whole by 50 is the portable electronic apparatus associated to the device 10, which includes a control unit 51 of its own connected to which are a first communication interface and a second communication interface, designated by 52 and 53, respectively. The interface 52 is represented by a communication module operating according to the same operating standard as that of the module 43 of the control unit 4. The interface 53 can be alternatively represented by a wired connection interface or else by a further wireless communication module, preferably operating according to a standard different from that of the module 52, for example the BLUETOOTH™ standard.

Designated as a whole by 100 is the internal control circuit of the device 10, connected to which are the safety control members 14 (enabling switch) and 15 (emergency stop), the position sensor 22, the ports 25-26, as well as two corresponding communication interfaces 101 and 102. The interface 101 is of a type similar to the communication interface 53 of the electronic apparatus 50, and can hence be alternatively represented by a wired connection interface or else by a wireless communication module, operating according to the same standard as that of the module 53. The interface 102 is, instead, of a type similar to the interface 44 of the control unit 4, and can hence be alternatively represented by a wired connection interface or else by a wireless communication module, operating according to the same standard as that of the module 44.

As may be readily understood, in the use of the device 10, the information corresponding to the status of the safety control members 14 and 15 is transmitted by the circuit 100 to the processing assembly 41, via the interfaces 102 and 44, and according to the status information received by the computer assembly 41, the device 10 manages the safety logic 42 of the unit 4. The communication line designated by A, which connects together the interfaces 102 and 44, may be, as has been said, represented by a cable or else by a wireless communication channel, preferably but not necessarily a bidirectional one. In the case of wireless communication, the modules 102 and 44 are pre-arranged for having a useful range of some meters in order to fall within the range of action of the device 10 with respect to the unit 4.

During programming, the operator can, via the touch screen 50a of the electronic apparatus 50, impart commands of various nature to the control unit 4, according to techniques in themselves known: for this purpose, of course, stored in the memory means of the electronic apparatus 50 is the software required for this purpose. This software is preferably pre-arranged for emulating at least part of the functions proper to a traditional teach pendant, obviously except for the safety functions, here managed via the device 10. Also the control unit 4 can communicate data of various nature to the device 50, once again according to techniques in themselves known. For example, via the display 50a of the electronic apparatus 50 it is possible to monitor the machine states, the program steps, possible alarms, and various parameters, such as the position of the axes of the robot. On the same display 50a, which is of a touch type, there may be for example emulated the keys necessary for governing movement of the axes of the robot 1, as well as the necessary programming and editing keys. Possibly, on the display there may also be emulated the functions of the means 4a of the control unit 4, of selection of the operating modes of the robot (programming mode, automatic mode, remote mode).

Exchange of information between the unit 4 and the electronic apparatus 50 occurs via a wireless communication line designated by B in FIG. 10, which is established between the modules 43 and 52; also the modules 43 and 52 are thus pre-arranged for having a useful range of some meters in order to enable the operator to move freely in the operating area of the robot.

When the interfaces 53 and 101 are represented by wireless communication modules it is preferable for these to be pre-arranged for having a limited useful range, indicatively not greater than one meter. In any case, as already mentioned, in addition to such a short-range communication it is in any case advantageous for the device 10 to be equipped with a sensor, such as the microswitch previously designated by 22, for detecting the physical presence of the electronic apparatus 50 on the control device 10 and hence preventing an operator from imparting commands on the robot via an electronic apparatus 50 set in the proximity of the control device 10, but not mounted thereon.

Of course, for exchange of information in wireless mode between the control unit 4 of the robot and the electronic apparatus 50 a unique pairing is necessary between the corresponding control systems, i.e., a condition of safe communication between them. A unique pairing, i.e., a safe communication, is likewise necessary between the device 10 and the control unit 4, when the information on the status of the control members 14 and 15 occurs in wireless mode. Also pairing between the electronic apparatus 50 and the device 10 must be unique, when it is not obtained via a cable.

The practical modalities of identification and safe communication between the unit 4, the device 10, and the electronic apparatus 50, when the aforesaid data communications occur in wireless mode, are irrespective of the purposes of the present invention and can be implemented according to any suitable technique known in the field, for example according to the techniques described in DE 102010025781 A1 which is herein incorporated by reference. As mentioned, in a preferred embodiment, when the communication between the control unit 4 and the device 10 occurs in wireless mode, it is preferable for there to be associated to a connection port of the device 10 a hardware token to provide unique authentication between the two control systems involved and guarantee a safe communication of the information on the status of the safety control members 14 and 15.

Figure 11:
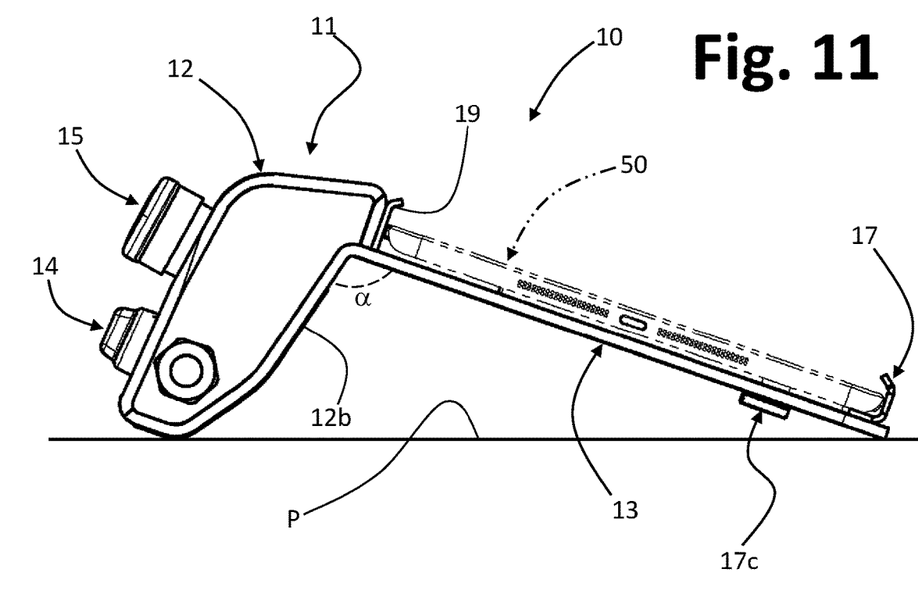
FIG. 11 is a schematic side view of one mode of use of a safety control device.
Figure 12:
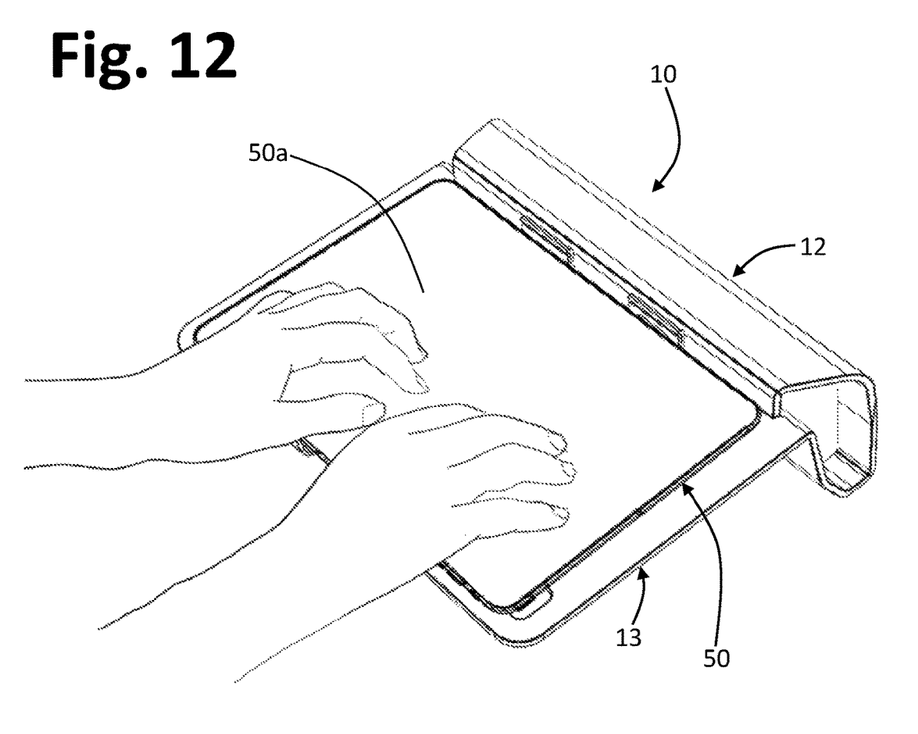
FIG. 12 is a schematic perspective view of an alternate mode of use of a safety control device.

Finally, with reference to FIG. 11, in various embodiments, the inner face 12b of the gripping portion 12 and the supporting portion 13 have relative positions such that the device 10 can be used as an inclined stand for the electronic apparatus 50, when the lower face 12b of the gripping portion 12 and the end region of the supporting portion 13 generally opposite to the gripping portion 12 are rested on a generic plane P. In this way, as is evident also from FIG. 12, the device 10 can be exploited for supporting the electronic apparatus 50 in an ergonomic position, for example for purposes of consultation and/or editing of data, in the course of steps of use of the electronic apparatus 50 that do not require manual control of movement of the robot.

From the above description, the characteristics of the present invention emerge clearly, as likewise do its advantages.

It is clear that numerous variations may be made by the person skilled in the art to the safety control device described herein by way example, without thereby departing from the scope of the invention as defined in the annexed claims.

The supporting portion 13 may be for example configured in the form of a grid in order to facilitate cooling of the electronic apparatus 50.

What is claimed is:

1. A portable safety control device for use with a removable portable electronic apparatus to communicate with an industrial machine having a control unit, the portable safety control device comprising:
   a gripping portion having a longitudinal length and comprising a first side wall, a second side wall opposite to the first side wall, an upper wall that connects the first side wall to the second side wall at upper portions thereof, and a lower wall that connects the first side wall to the second side walls at lower portions thereof, with the first side wall, the second side wall, the upper wall and the lower wall that define a substantially tubular shape of the gripping portion operable to be gripped by a portion of a first human hand;
   an enabling switch mounted on the first side wall, at a center region along a longitudinal length of the first side wall, the enabling switch being operable by at least one finger of the first human hand gripping the gripping portion;
   an emergency stop switch mounted on the first side wall, at a center region along a longitudinal length of the first side wall, the emergency stop switch being operable by a second human hand;
   a control circuitry in electronic signal communication with the enabling switch and the emergency stop switch, the control circuitry being housed within a hollow defined by the substantially tubular shape of the gripping portion;
   a first communication interface at the gripping portion in electronic signal communication with the control circuitry, the first communication interface being operable to electronically communicate with the removable portable electronic apparatus;
   a second communication interface at the gripping portion in electronic signal communication with the control circuitry, the second communication interface being operable to electronically communicate with the control unit of the industrial machine;
   a plate-shaped supporting portion connected to the gripping portion in a fixed position relative thereto, the plate-shaped supporting portion extending laterally from the second side wall of the gripping portion in a cantilever manner and having an exposed top surface defining a resting area for a back of the removable portable electronic apparatus, the plate-shaped supporting portion also having an exposed bottom surface opposite to the top surface and operable to be supported by a forearm connected to the first human hand gripping the gripping portion; and
   a constraint device connected to at least one of the gripping portion or the plate-shaped supporting portion, the constraint device being operable to removably secure the removable portable electronic apparatus to the plate-shaped supporting portion with the back thereof resting on the resting area defined by the exposed top surface of the plate-shaped supporting portion;
   wherein the resting area defined by the exposed top surface of the plate-shaped supporting portion, the constraint device and the first communication interface are operable for enabling use of the portable safety control device with removable portable electronic apparatuses having different lateral dimensions.

2. The device according to claim 1, wherein the emergency stop switch is mounted on the first side wall vertically above and in alignment with the enabling switch at the center region of the longitudinal length of the first side wall, the emergency stop switch and the enabling switch being aligned in a direction transverse to the longitudinal length of the first side wall.

3. The device according to claim 1, wherein the plate-shaped supporting portion extends in a cantilever manner from an intermediate region of the second side wall of the gripping portion, the intermediate region being closer to the upper wall than to the lower wall.

4. The device according to claim 1, wherein the constraint device comprises at least one constraint member mounted on the plate-shaped supporting portion in one of an adjustable, an elastically deformable, or sliding manner relative to the supporting portion.

5. The device according to claim 1, wherein the constraint device comprises at least one constraint member at the second side wall of the gripping portion.

6. The device according to claim 5, wherein the plate-shaped supporting portion extends in a cantilever manner from an intermediate region of the second side wall of the gripping portion, and the at least one constraint member is located at the second side wall of the gripping portion above the intermediate region.

7. The device according to claim 6, wherein the at least one constraint member has a longitudinal length smaller that a longitudinal length of the second side wall and defines a seat operable for removably receiving an edge portion of the removable portable electronic apparatus.

8. The device according to claim 1, wherein the plate-shaped supporting portion comprises at least one of a through opening or a peripheral recess, the at least one through opening or peripheral recess operable to enable image taking through the at least one through opening or peripheral recess by a corresponding rear image-shooting element at the back of the removable portable electronic apparatus.

9. The device according to claim 1, wherein mounted at the gripping portion is a position sensor operable to detect physical presence of the removable portable electronic apparatus in the resting area defined by the top surface of the plate-shaped supporting portion, the position sensor being in signal communication with the control circuitry, and wherein the first communication interface comprises a wireless transceiver module.

10. The device according to claim 9, wherein the plate-shaped supporting portion extends in a cantilever manner from an intermediate region of the second side wall of the gripping portion, and the position sensor is located at the second side wall of the gripping portion above the intermediate region.

11. The device according to claim 1, wherein the gripping portion further comprises two opposing longitudinal end walls, which close the hollow defined by the tubular shape of the gripping portion at both opposite longitudinal ends.

12. The device according to claim 11, wherein one of the longitudinal end walls has a connection port connected in signal communication with the control circuitry.

13. The device according to claim 11, wherein one of the longitudinal end walls has a bushing element operable for passage of a cable for connecting the control circuitry to the control unit of the industrial machine.

14. The device according to claim 1, wherein:
the first communication interface comprises a wireless communication module operable to communicate with a wireless communication module of the control unit of the industrial machine;
the control circuitry comprises a connection port accessible from outside the gripping portion; and
the safety control device further comprises a safety token removably connectable to the connection port and operable to establish a unique pairing between the control unit of the industrial machine and the wireless communication module of the first communication interface of the safety control device, for the purposes of safe communication of information on a safety status of at least one of the enabling switch and the emergency stop switch.

15. The device according to claim 1, wherein:
the plate-shaped supporting portion has an end region opposite to the second side wall of the gripping portion, and
the end region of the plate-shaped supporting portion and the lower wall of the gripping portion are operable to position the portable safety control device as an inclined stand on resting the end region of the plate-shaped supporting portion and the lower wall of the gripping portion on a generic plane.

16. The device according to claim 1, wherein the gripping portion and the plate-shaped supporting portion are made of a single piece.

17. The device according to claim 1, wherein the second side wall of the gripping portion has a longitudinal length, and the plate-shaped supporting portion has a longitudinal length substantially the same as the longitudinal length of the second side wall.

18. The device according to claim 1, wherein the second side wall of the gripping portion has a longitudinal length and the plate-shaped supporting portion has an end region opposite to the second side wall, the end region extending parallel to the longitudinal length of the second side wall.

19. The device according to claim 1, wherein the plate-shaped supporting portion defines a through slot extending laterally along a portion of the plate-shaped supporting portion, the constraint device comprising:
a constraint body having at least one arm and a stem connected to the at least one arm, wherein the at least one arm extends above the exposed top surface of the plate-shaped supporting portion and the stem extends through the slot beyond the exposed bottom surface of the plate-shaped supporting portion opposite the exposed top surface; and
a clamping member moveably engaged with the stem, the constraint body being operable to be selectively positioned along the slot and the clamping member being operable to selectively lock the at least one arm in a lateral position relative to the gripping portion.

20. An industrial machine comprising a portable safety control device according to claim 1.

* * * * *